(12) United States Patent
Tzou et al.

(10) Patent No.: US 9,078,353 B2
(45) Date of Patent: Jul. 7, 2015

(54) COPPER FOIL STRUCTURE HAVING BLACKENED ULTRA-THIN FOIL AND MANUFACTURING METHOD THEREOF

(71) Applicant: NAN YA PLASTICS CORPORATION, Taipei (TW)

(72) Inventors: Ming-Jen Tzou, Taipei (TW); Kuo-Chao Chen, Taipei (TW); Ya-Mei Lin, Taipei (TW)

(73) Assignee: Nan Ya Plastics Corporation, Taipei (TW)

( * ) Notice: Subject to any disclaimer, the term of this patent is extended or adjusted under 35 U.S.C. 154(b) by 0 days.

(21) Appl. No.: 14/028,682

(22) Filed: Sep. 17, 2013

(65) Prior Publication Data
US 2014/0141274 A1 May 22, 2014

(30) Foreign Application Priority Data
Nov. 16, 2012 (TW) .............................. 101142836 A

(51) Int. Cl.
*H05K 9/00* (2006.01)
*H05K 3/02* (2006.01)
(Continued)

(52) U.S. Cl.
CPC ................ *H05K 3/022* (2013.01); *H05K 1/09* (2013.01); *Y10T 428/1291* (2015.01); *Y10T 428/12396* (2015.01); *Y10T 428/12903* (2015.01);
(Continued)

(58) Field of Classification Search
CPC .............................. A01B 12/006; H05K 3/022
USPC .................. 174/389; 428/615, 469, 632, 655, 428/472.1, 472.3, 635, 661, 666, 667, 675
See application file for complete search history.

(56) References Cited

U.S. PATENT DOCUMENTS

| 6,447,929 B1 * | 9/2002 | Wang et al. .................. 428/604 |
| 6,541,126 B1 | 4/2003 | Yoshioka et al. |

(Continued)

FOREIGN PATENT DOCUMENTS

| JP | 2001-62955 A | 3/2001 |
| JP | 2005-48277 A | 2/2005 |

(Continued)

OTHER PUBLICATIONS

Communication From the Korean Patent Office Regarding a Counterpart Foreign Application Dated Sep. 25, 2014.
Communication From the Korean Patent Office Regarding a Counterpart Foreign Application Dated Sep. 9, 2014.
Communication From the Taiwan Patent Office Regarding a Counterpart Foreign Application Dated (Taiwan Year 103) Dec. 3, 2014, TW application No. 101142836.

*Primary Examiner* — Cathy Lam
(74) *Attorney, Agent, or Firm* — Rosenberg, Klein & Lee

(57) ABSTRACT

A copper foil structure having blackened ultra-thin copper foil of the instant disclosure includes a carrier foil, a blackened layer, a release layer, and an ultra-thin copper foil. The carrier foil includes a matte surface and a shiny surface wherein the blackened layer is disposed thereon. The release layer is disposed on the blackened layer formed with one selected from the group: copper, cobalt, nickel, and manganese while the release layer is formed with one selected from the group: molybdenum, nickel, chromium, and potassium. Successively, the ultra-thin copper foil is disposed on the release layer. Laser drilling can apply to the blackened ultra-thin copper foil on the inner layers of a high density multi-layer printed wiring board, thus eliminating the traditional blackening or browning chemical process. The blackened ultra-thin copper foil in combination with a polyimide thin (PI) or other substrate materials displays desirable appearance.

6 Claims, 8 Drawing Sheets

(51) Int. Cl.
*H05K 1/09* (2006.01)
*B32B 15/20* (2006.01)
*C25D 7/06* (2006.01)
*C25D 1/04* (2006.01)
*C25D 3/38* (2006.01)
*C25D 3/56* (2006.01)
*C25D 5/14* (2006.01)
*H05K 3/38* (2006.01)
*H05K 3/00* (2006.01)

(52) U.S. Cl.
CPC .............. *B32B15/20* (2013.01); *C25D 7/0614* (2013.01); *C25D 1/04* (2013.01); *C25D 3/38* (2013.01); *C25D 3/562* (2013.01); *C25D 5/14* (2013.01); *H05K 3/025* (2013.01); *H05K 3/384* (2013.10); *H05K 2201/0355* (2013.01); *H05K 3/0038* (2013.01); *H05K 2203/0152* (2013.01); *H05K 2203/0307* (2013.01); *H05K 2203/0723* (2013.01); *H05K 2203/0726* (2013.01)

(56) References Cited

U.S. PATENT DOCUMENTS

| | | | |
|---|---|---|---|
| 7,026,059 B2 | 4/2006 | Suzuki et al. | |
| 7,049,007 B2 | 5/2006 | Gales et al. | |
| 7,175,920 B2 * | 2/2007 | Suzuki et al. | 428/615 |
| 7,304,250 B2 * | 12/2007 | Arakawa et al. | 174/381 |
| 7,651,783 B2 * | 1/2010 | Tsuchida et al. | 428/626 |
| 7,754,981 B2 * | 7/2010 | Arakawa et al. | 174/389 |
| 7,771,841 B2 | 8/2010 | Suzuki et al. | |

FOREIGN PATENT DOCUMENTS

| | | |
|---|---|---|
| JP | 2009-235580 A | 10/2009 |
| JP | 2012-219368 A | 11/2012 |
| KR | 10-2004-0022465 A | 3/2004 |
| KR | 10-2007-0064282 A | 6/2007 |
| WO | 02/24444 A1 | 3/2002 |

* cited by examiner

COPPER FOIL STRUCTURE HAVING BLACKENED ULTRA-THIN FOIL AND MANUFACTURING METHOD THEREOF

BACKGROUND OF THE INVENTION

1. Field of the Invention

The instant disclosure relates to a copper foil having carrier foil; in particular, to a peelable cooper foil structure having blackened ultra-thin foil and the manufacturing method thereof.

2. Description of Related Art

As the electronics industry trends towards lighter, thinner and more miniaturized electrical components, higher demand for precise circuitry and thin copper foil such as electrodeposited copper foil is necessary. Electrodeposited copper foil including a carrier foil is commonly used in the electronics industry for high precision and density circuitry in printed circuit board assemblies.

Generally speaking, electrodeposited copper foil including a carrier foil is categorized by peelable type and etchable type. Peelable type is defined by physically removing the carrier foil after the formation of the copper clad laminate substrate while the etchable type is defined by chemically removing the carrier foil after the formation of the copper clad laminate substrate. However, the demand for the etching process is becoming less significant.

The traditional electrodeposited copper foil includes a carrier foil (copper or aluminum foil), a release layer generally formed from metal oxides onto the carrier foil, and a super-thin copper foil generally formed on the release layer. When the carrier foil is physically removed from a super-thin copper foil, the surface of the super-thin copper foil will display a shiny appearance. However, when the super-thin copper foil is applied on inner layers of the multilayer circuit board, a blackening or browning process is required to provide the super-thin copper foil a blackened or browned appearance and enhanced bonding with the substrate formed thereon afterwards.

During the manufacturing of printed circuit board, high density and precision circuitry components such as microvias having diameter of less than 200 m generally requires laser drilling. However, due to the shiny surface of the super-thin copper foil, laser rays tends to be reflected, and excess operation of the laser is required, thus rendering higher energy consumption or multiple attempts are required to form the microvias. Furthermore, during high temperature compression process, the temperature of the super-thin copper foil is as high as 300° C., and the metallic bonding formed via an oxidation-reduction reaction between the metal oxides and the copper metal may affect consistency in peeling strength, thus affecting the peeling properties of the carrier foil and the super-thin copper foil.

To address the above issues, the inventor strives via associated experience and research to present the instant disclosure, which can effectively improve the limitation described above.

SUMMARY OF THE INVENTION

In the instant disclosure, a copper foil structure having blackened ultra-thin copper foil and can appear with a single-sided, double-sided, triple-sided, or quadruple-sided appearance is formed by a copper carrier foil, a blackened layer, a release layer, and an ultra-thin copper foil. The carrier foil is a very low profile copper foil from NANYA Plastic Corporation having a uniform surface morphology while being smooth and pinhole free.

Moreover, the release layer is one of the most significant factors affecting the bonding strength between the carrier foil and the ultra-thin copper foil. The release layer is formed with one selected from the group: molybdenum, nickel, chromium, and potassium. Even under high temperature compression, the carrier foil and the ultra-thin copper foil still have desirable peeling properties. Furthermore, the blackened layer is formed with one selected from the group: copper, cobalt, nickel, and manganese which render the surface of the ultra-thin copper foil (immediate to the contact surface of the copper carrier) to display a blackened appearance. Hereby, direct laser drilling can be applied, thus eliminating the traditional blackening and browning process, shielding electromagnetic waves, and providing an aesthetically pleasant appearance.

According to an embodiment of the instant disclosure, the copper foil structure having blackened ultra-thin copper foil includes a carrier foil, a blackened layer, a release layer, and an ultra-thin copper foil. The carrier foil includes a matte surface and a shiny surface in which the blackened layer is disposed thereon. The release layer is disposed on the blackened layer which is formed with one selected from the group: copper, cobalt, nickel, and manganese while the release layer is formed with one selected from the group: molybdenum, nickel, chromium, and potassium. Successively, the ultra-thin copper foil is disposed on the release layer.

According to another embodiment, the method for manufacturing the copper foil structure having blackened ultra-thin copper foil includes initially providing a carrier foil having a shiny surface and a matte surface, then forming a blackened layer on the shiny surface of the carrier foil in which the blackened layer is made of a material selected from the group consisting of copper, cobalt, nickel, manganese, and the combination thereof. Next, a release layer is formed on a blackened layer and is made of a material selected from the group consisting of molybdenum, nickel, chromium, potassium, and the combination thereof. Subsequently, an ultra-thin copper foil is formed on the release layer. Preferably, the carrier foil is a very low profile copper foil. The blackened layer is preferably an alloy formed by copper, cobalt, nickel and manganese and the thickness is preferably from about 0.1 to 0.3 m.

In summary, the blackened layer of the instant disclosure is preferably made of a material selected from the group consisting of copper, cobalt, nickel, manganese, and the combination thereof to eliminate the traditional blackening or browning process, thus lowering the production cost. Meanwhile, the release layer formed between the carrier foil and the ultra-thin copper foil is made of a material selected from the group consisting of molybdenum, nickel, chromium, potassium, and the combination thereof. Hereby, maintaining desirable peeling properties and bonding strength between the carrier foil and the ultra-thin copper foil after the high temperature compression process.

In order to further understand the instant disclosure, the following embodiments and illustrations are provided. However, the detailed description and drawings are merely illustrative of the disclosure, rather than limiting the scope being defined by the appended claims and equivalents thereof.

DETAILED DESCRIPTION OF THE PREFERRED EMBODIMENTS

Figure 1:
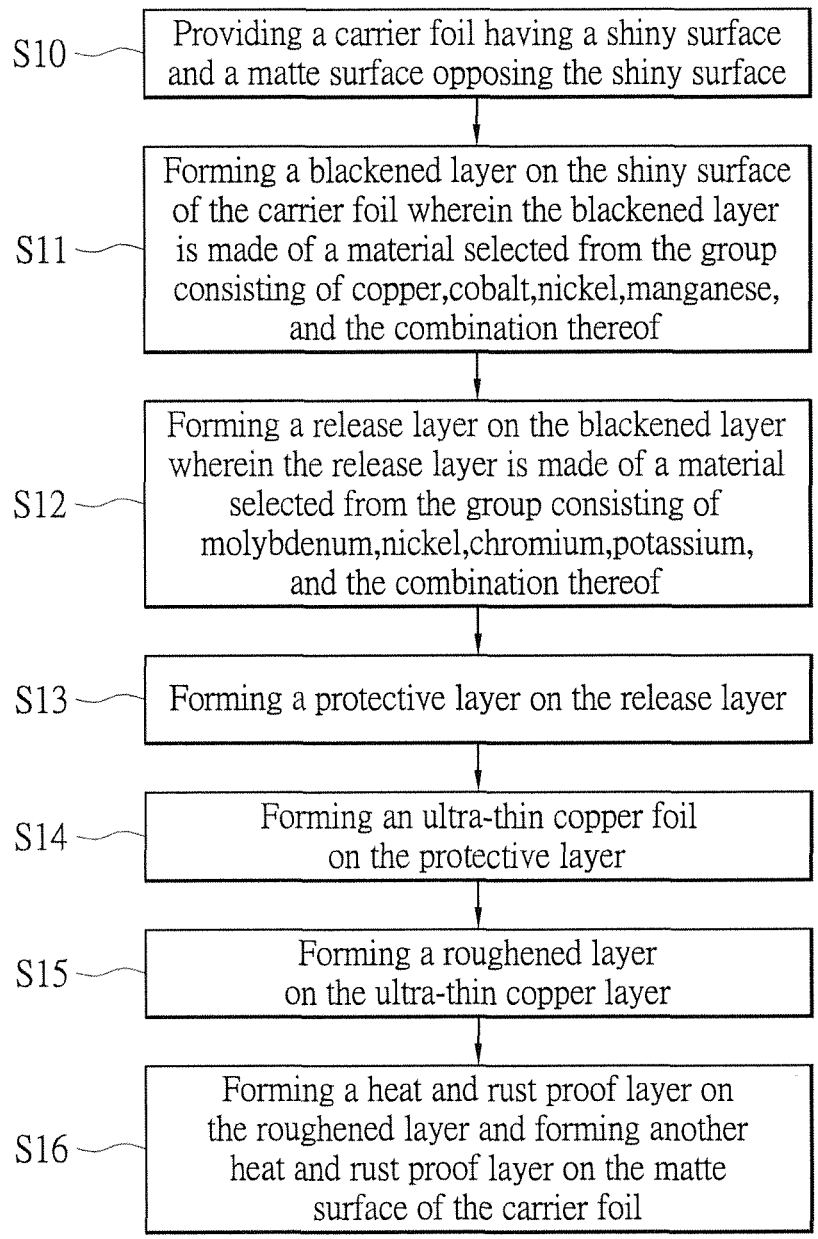
FIG. 1 is a flow diagram of the manufacturing method according to a first embodiment of the instant disclosure.
Figure 1A:
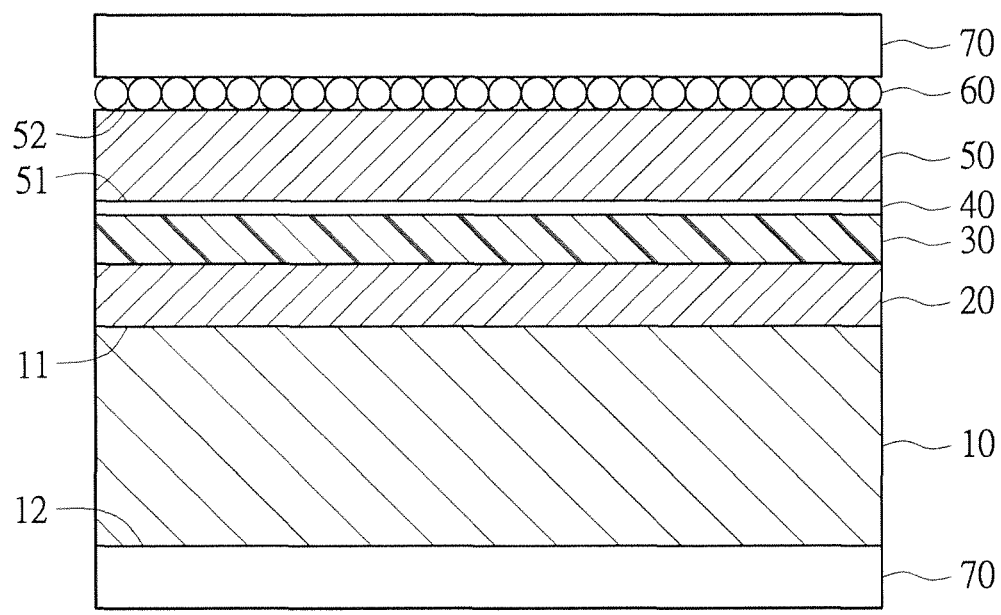
FIG. 1A is a cross-sectional view of a manufactured copper foil structure according to the first embodiment of the instant disclosure.

In FIGS. 1 and 1A, a flow diagram and a cross-sectional view of the method for manufacturing a copper foil structure with blackened ultra-thin copper foil respectively illustrate a first embodiment of the instant disclosure. Briefly, the method is initiated with a carrier foil 10 having a shiny surface 11 and a matte surface 12. Next, a blackened layer 20 is formed on the shiny surface 11 of the carrier foil 10 in which the blackened layer 20 is made of a material selected from the group consisting of copper, cobalt, nickel, manganese, and the combination thereof. Next, a release layer 30 is formed on the blackened layer 20, in which the release layer 30 is made of a material selected from the group consisting of molybdenum, nickel, chromium, potassium, and the combination thereof. Next, a protective layer 40 is formed on the release layer 30, and then an ultra-thin copper foil 50 is formed on the protective layer 40. Then a roughened layer 60 is formed on the ultra-thin copper foil 50. Successively, two heat and rust proof layer 70 are formed, while one of the heat and rust proof layers 70 is formed on the roughened layer 60, the other heat and rust proof layer 70 is formed on the matte surface 12 of the carrier foil 10.

In further details, the carrier foil 10 is a very low profile (VLP) copper foil from South Asia, of which the thickness ranges from about 18 to 35 m, and is near a cathode side and a side of a plating solution of the copper foil displaying a shiny appearance. Moreover, the carrier foil 10 exhibits low roughness and has thickness similar to the size of a pinhole. The surface roughness (parameter used: an average of 10 points (Rz)) of the carrier foil 10 is less than 2.0 µm and is defined by the shiny surface 11 and the matte surface 12. The carrier foil 10 is then immersed into a plurality of plating baths to electrodeposit different layers thereon.

Initially, the carrier foil 10 is immersed into a quaternary alloy plating bath having a nickel sulfate hexahydrate concentration of about 1 to 40 g/L, a copper sulfate pentahydrate concentration of about 10 to 60 g/L, a cobalt sulfate heptahydrate concentration of about 10 to 50 g/L, and a manganese sulfate hydrate concentration of about 10 to 40 g/L to form the blackened layer 20 thereon. The pH of the plating bath ranges from about 1 to 10, while the temperature ranges from about 10 to 60° C., the electric flux ranges from about 1 to 20 A/dm$^2$, and the energizing time is about 15 seconds. Moreover, the blackened layer 20 is preferably a metal alloy formed with a combination of the group consisting of copper, cobalt, nickel, and manganese. When the ultra-thin copper layer 50 is separated from the copper foil 10, a residue of the blackened layer 20 might be left behind on the shiny surface 51 of the ultra-thin copper layer 50 rendering a black or dark gray appearance. Such appearance can suppress external light reflections, provide desirable etching properties, and be suitable for laser drilling process.

Next, The carrier foil 10 along with the blackened layer 20 are then immersed into a quaternary alloy plating bath having a nickel sulfate hexahydrate concentration of about 10 to 50 g/L, a sodium molybdate dihydrate concentration of about 0.5 to 10 g/L, a potassium pyrophosphate ($K_4P_2O_7$) concentration of about 50 to 100 g/L, and a chromium trioxide ($CrO_3$) concentration of about 0.5 to 2 g/L to form the release layer 30 onto the blackened layer 20. The pH of the plating bath ranges from about 1 to 10, while the temperature ranges from about 10 to 50° C., the electric flux ranges from about 1 to 2.5 A/dm$^2$, and the energizing time is about 20 seconds. Moreover, the release layer 30 is preferably a metal alloy formed with a combination of the group consisting of molybdenum, nickel, chromium, and potassium. Hereby, after hot pressing, the carrier foil 10 and the ultra-thin copper foil 50 still retain desirable adhesion therebetween without being fused together.

The carrier foil 10 along with the blackened layer 20 and the release layer 30 are immersed into a plating bath having a cupric pyrophosphate ($Cu_2P_2O_7 \cdot 3H_2O$) concentration of about 10 to 60 g/L, and a potassium pyrophosphate ($K_4P_2O_7$) concentration of about 100 to 400 g/L to form the protective layer 40 on the release layer 30. The pH of the plating bath ranges from about 6 to 10, while the temperature ranges from about 10 to 60° C., the electric flux ranges from about 1 to 5 A/dm$^2$, and the energizing time is about 15 seconds. The protective layer 40 is a cupric pyrophosphate layer which can prevent the release layer 30 to be washed off by a copper sulfate plating bath, thus the subsequent formation and the peel strength of the ultra-thin copper foil 50 will not be affected.

The carrier foil 10 along with the blackened layer 20, the release layer 30, and the protective layer 40 are immersed into a plating bath having a copper ion concentration of about 50 to 100 g/L and a sulfuric acid concentration of about 90 to 125 g/L to form the ultra-thin copper layer 50 having a shiny surface 51 and a matte surface 52 on to the protective layer 40. The plating bath temperature ranges from about 40 to 70° C., the electric flux is about 25 A/dm$^2$, and the energizing time is about 20 seconds. The thickness of the ultra-thin copper layer 50 ranges from about 1 to 6 µm.

Subsequently, the matte surface 52 of the ultra-thin copper foil 50 is treated with copper nanoparticles via the conventional roughened process to form the roughened layer 60. Successively, the roughened layer 60 and the matte surface 12 are rustproof with the application of galvanized zinc, nickel and chromate, and then are coated with silane rendering two heat and rust proof layers 70 to form on both the roughened layer 60 and the matte surface 12 of the copper foil 10. Thus, resulting with the first embodiment of the copper foil structure having blackened ultra-thin foil. In addition, the heat and rust proof layer 70 and the roughened layer 60 can enhance the peel strength between the ultra-thin copper foil 50 and a substrate (not shown) during peeling while the heat and rust proof layer 70 can provide rustproof and heat resisting effects to the carrier foil 10. The peel strength is referred to as the maximum load per unit width that is required to separate two units adhered to one another.

Figure 2:
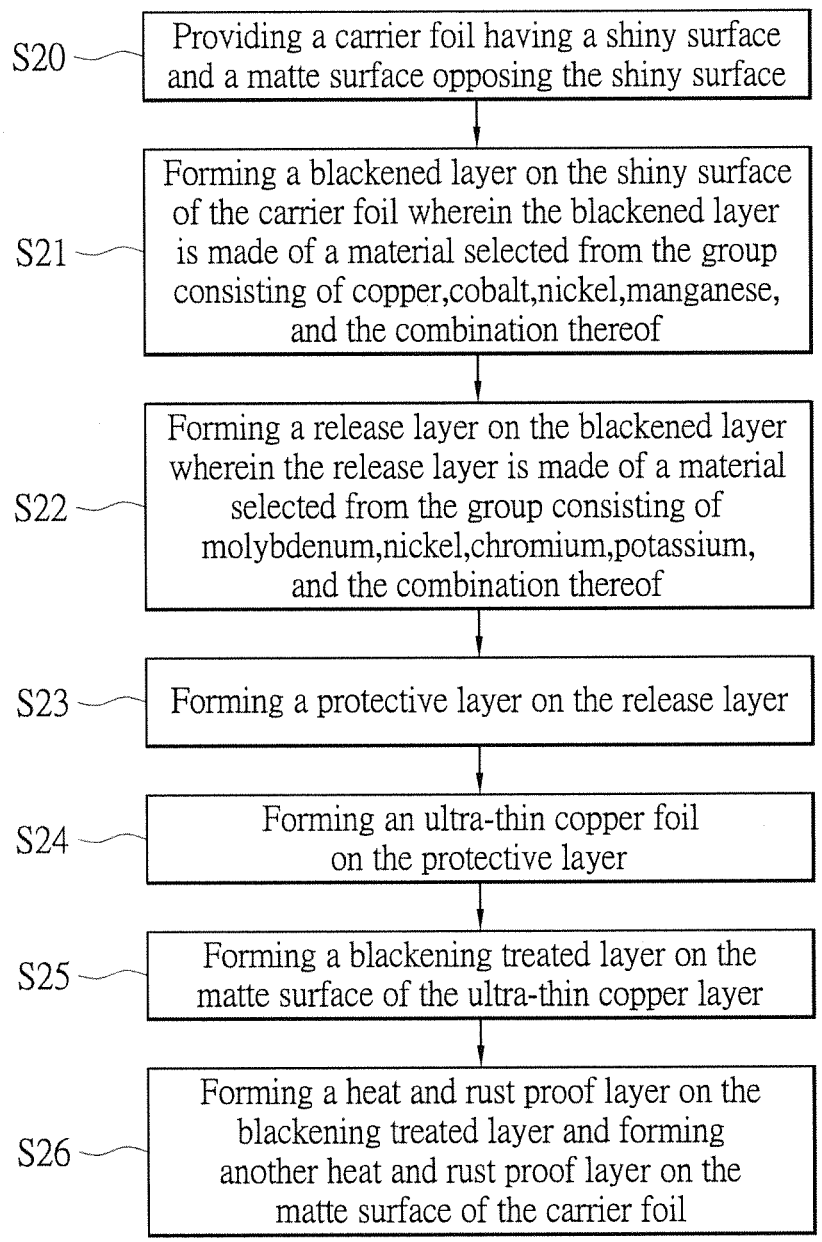
FIG. 2 is a flow diagram of the manufacturing method according to a second embodiment of the instant disclosure.
Figure 2A:
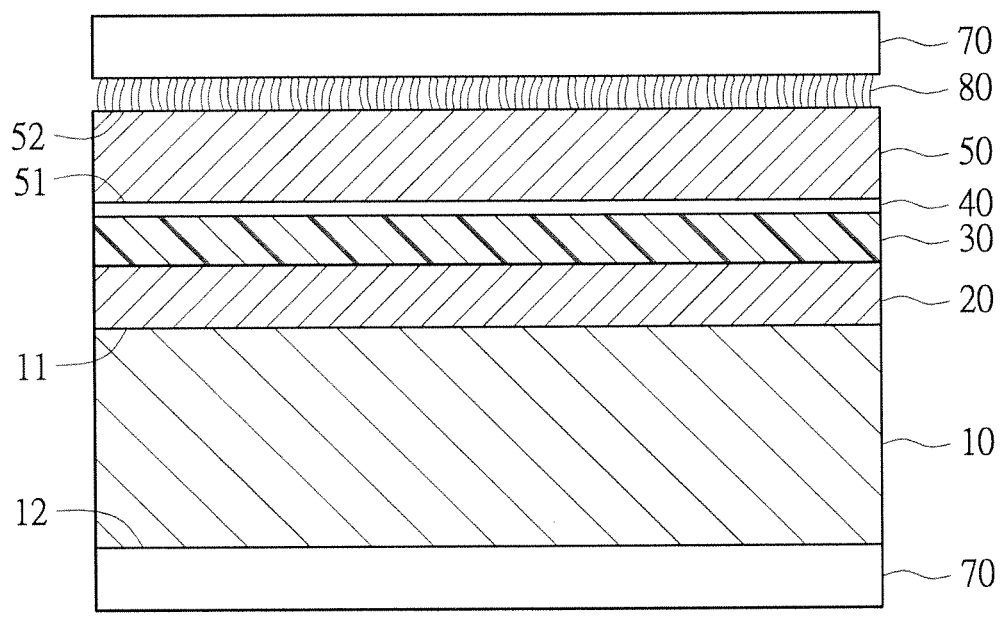
FIG. 2A is a cross-sectional view of a manufactured copper foil structure according to the second embodiment of the instant disclosure.

In FIGS. 2 and 2A, a flow diagram and a cross-sectional view of the method for manufacturing a copper foil structure with blackened ultra-thin copper foil respectively illustrate a second embodiment of the instant disclosure. Briefly, the method is initiated with a carrier foil 10 having a shiny surface 11 and a matte surface 12. Next, a blackened layer 20 is formed on the shiny surface 11 of the carrier foil 10, in which the blackened layer 20 is made of a material selected from the group consisting of copper, cobalt, nickel, manganese, and the combination thereof. Next, a release layer 30 is formed on the blackened layer 20, in which the release layer 30 is made of a material selected from the group consisting of molybdenum, nickel, chromium, potassium, and the combination thereof. Next, a protective layer 40 is formed on the release layer 30, and then an ultra-thin copper foil 50 having a shiny surface 51 and a matte surface 52 is formed on the protective layer 40. Then a blackening treated layer 80 is formed on the matte surface 52 of the ultra-thin copper layer 50. Successively, two heat and rust proof layer 70 are formed, while one of the heat and rust proof layers 70 is formed on the blackening treated layer 80, the other heat and rust proof layer 70 is formed on the matte surface 12 of the carrier foil 10.

In further details, the carrier foil 10 is a very low profile (VLP) copper foil from South Asia, of which the thickness ranges from about 18 to 35 m, and is near a cathode side and a side of a plating solution of the copper foil displaying a shiny appearance. Moreover, the carrier foil 10 exhibits low roughness and thickness similar to the size of a pinhole. The surface roughness (parameter used: an average of 10 points (Rz)) of the carrier foil 10 is less than 2.0 m and is defined by the shiny surface 11 and the matte surface 12. The carrier foil 10 is then immersed into a plurality of plating baths to electrodeposit different layers thereon.

Initially, the carrier foil 10 is immersed into a quaternary alloy plating bath having a nickel sulfate hexahydrate concentration of about 1 to 40 g/L, a copper sulfate pentahydrate concentration of about 10 to 60 g/L, a cobalt sulfate heptahydrate concentration of about 10 to 50 g/L, and a manganese sulfate hydrate concentration of about 10 to 40 g/L to form the blackened layer 20. The pH of the plating bath ranges from about 1 to 10, while the temperature ranges from about 10 to 60° C., the electric flux ranges from about 1 to 20 A/dm$^2$, and the energizing time is about 15 seconds. Moreover, the blackened layer 20 is preferably a metal alloy formed with a combination of the group consisting of copper, cobalt, nickel, and manganese.

The carrier foil 10 along with the blackened layer 20 are then immersed into a quaternary alloy plating bath having a nickel sulfate hexahydrate concentration of about 10 to 50 g/L, a sodium molybdate dihydrate concentration of about 0.5 to 10 g/L, a potassium pyrophosphate ($K_4P_2O_7$) concentration of about 50 to 100 g/L, and a chromium trioxide ($CrO_3$) concentration of about 0.5 to 2 g/L to form the release layer 30 onto the blackened layer 20. The pH of the plating bath ranges from about 1 to 10, while the temperature ranges from about 10 to 50° C., the electric flux ranges from about 1 to 2.5 A/dm$^2$, and the energizing time is about 20 seconds. Moreover, the release layer 30 is preferably a metal alloy formed with a combination of the group consisting of molybdenum, nickel, chromium, and potassium.

The carrier foil 10 along with the blackened layer 20 and the release layer 30 are immersed into a plating bath having a cupric pyrophosphate ($Cu_2P_2O_7 \cdot 3H_2O$) concentration of about 10 to 60 g/L, and a potassium pyrophosphate ($K_4P_2O_7$) concentration of about 100 to 400 g/L to form the protective layer 40 on the release layer 30. The pH of the plating bath ranges from about 6 to 10, while the temperature ranges from about 10 to 60° C., the electric flux ranges from about 1 to 5 A/dm$^2$, and the energizing time is about 15 seconds. The protective layer 40 is a cupric pyrophosphate layer.

The carrier foil 10 along with the blackened layer 20, the release layer 30, and the protective layer 40 are immersed into a plating bath having a copper ion concentration of about 50 to 100 g/L and a sulfuric acid concentration of about 90 to 125 g/L to form the ultra-thin copper layer 50 having a shiny surface 51 and a matte surface 52 on the protective layer 40. The plating bath temperature ranges from about 40 to 70° C., the electric flux is about 25 A/dm$^2$, and the energizing time is about 20 seconds. The thickness of the ultra-thin copper layer 50 ranges from about 1 to 6 μm.

Next, the carrier foil 10 along with the blackened layer 20, the release layer 30, the protective layer 40, and the ultra-thin copper foil 50 are immersed into a quaternary alloy plating bath having a nickel sulfate hexahydrate concentration of about 1 to 40 g/L, a copper sulfate pentahydrate concentration of about 10 to 60 g/L, a cobalt sulfate heptahydrate concentration of about 10 to 50 g/L, and a manganese sulfate hydrate concentration of about 10 to 40 g/L and passed through a weaving process to form the blackening treated layer 80 on the matte surface 52 of the ultra-thin copper layer 50. Hereby, providing a dark black appearance on the matte surface 52 and enhancing peel strength between the ultra-thin copper foil 50 and a substrate (not shown) during peeling. The pH of the plating bath ranges from about 1 to 10, while the temperature ranges from about 10 to 60° C., the electric flux ranges from about 1 to 20 A/dm$^2$, and the energizing time is about 15 seconds.

Successively, the blackening treated layer 80 and the matte surface 12 of the carrier foil 10 are rustproof with the application of galvanized zinc, nickel and chromate, and then are coated with silane rendering two heat and rust proof layers 70 to form on both the blackening treated layer 80 and the matte surface 12 of the copper foil 10. Thus, resulting with the second embodiment of the copper foil structure having blackened ultra-thin foil.

Figure 3:
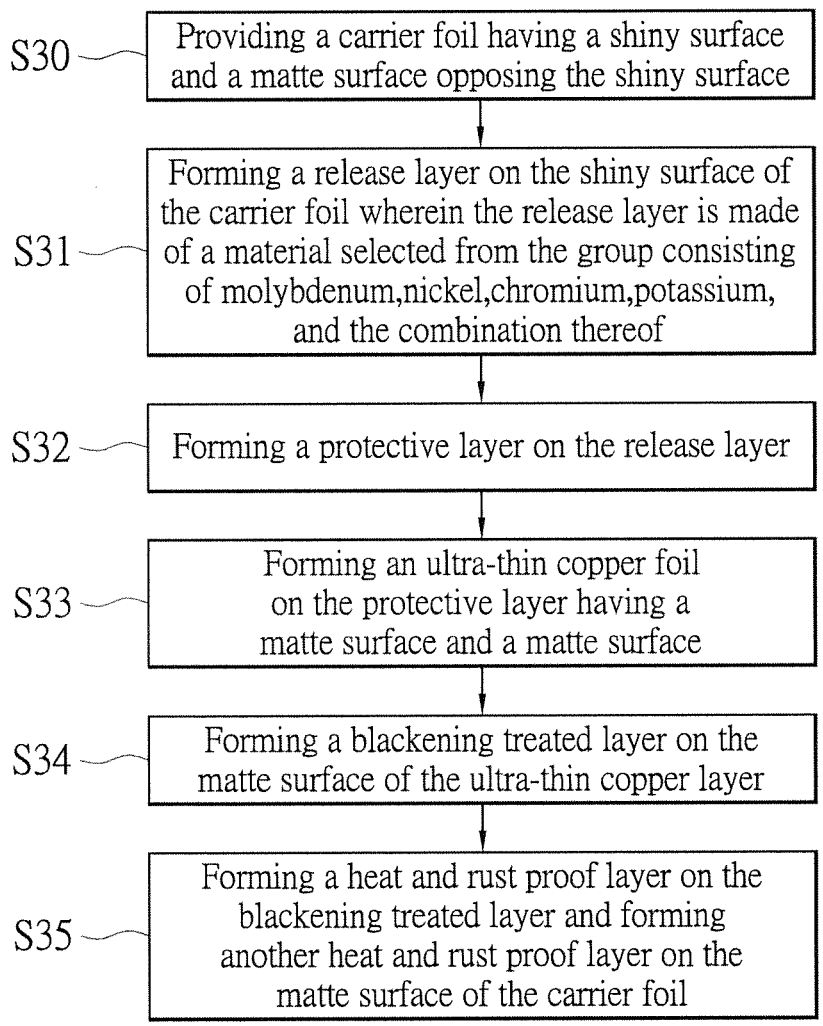
FIG. 3 is a flow diagram of the manufacturing method according to a third embodiment of the instant disclosure.
Figure 3A:
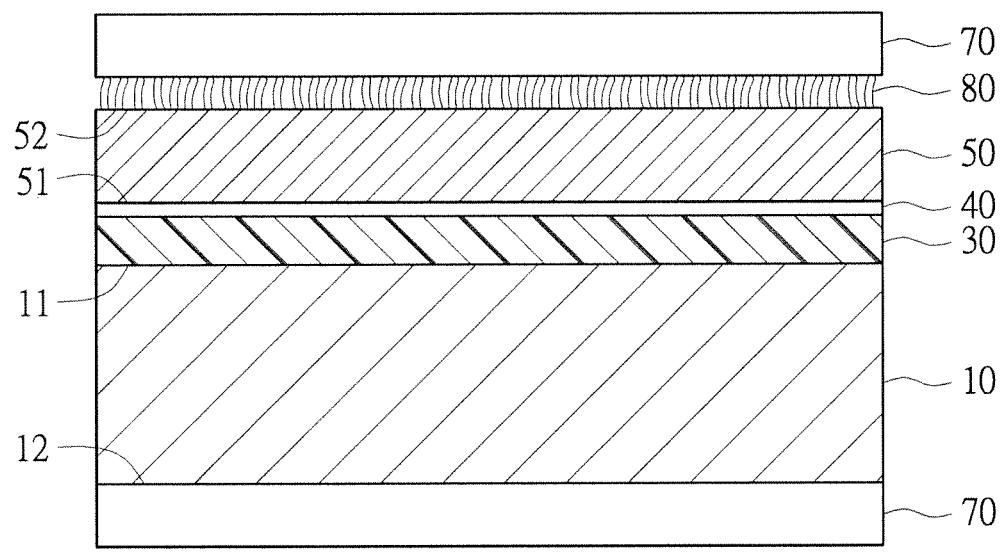
FIG. 3A is a cross-sectional view of a manufactured copper foil structure according to the third embodiment of the instant disclosure.

In FIGS. 3 and 3A, a flow diagram and a cross-sectional view of the method for manufacturing a copper foil structure with blackened ultra-thin copper foil respectively illustrate a third embodiment of the instant disclosure. Briefly, the method is initiated with a carrier foil 10 having a shiny surface 11 and a matte surface 12. Next, a release layer 30 is formed on the shiny surface 11 of the carrier foil 10, in which the release layer 30 is made of a material selected from the group consisting of molybdenum, nickel, chromium, potassium, and the combination thereof. Next, a protective layer 40 is formed on the release layer 30, and then an ultra-thin copper foil 50 having a shiny surface 51 and a matte surface 52 is formed on the protective layer 40. Then a blackening treated layer 80 is formed on the matte surface 52 of the ultra-thin copper layer 50. Successively, two heat and rust proof layer 70 are formed, while one of the heat and rust proof layers 70 is formed on the blackening treated layer 80, the other heat and rust proof layer 70 is formed on the matte surface 12 of the carrier foil 10.

In further details, the carrier foil 10 is a very low profile (VLP) copper foil from South Asia, of which the thickness ranges from about 18 to 35 m, and is near a cathode side and a side of a plating solution of the copper foil displaying a shiny appearance. Moreover, the carrier foil 10 exhibits low roughness and thickness similar to the size of a pinhole. The surface roughness (parameter used: an average of 10 points (Rz)) of the carrier foil 10 is less than 2.0 m and is defined by the shiny surface 11 and the matte surface 12. The carrier foil 10 is then immersed into a plurality of plating baths to electrodeposit different layers thereon.

Initially, the carrier foil 10 is immersed into a quaternary alloy plating bath having a nickel sulfate hexahydrate concentration of about 10 to 50 g/L, a sodium molybdate dihydrate concentration of about 0.5 to 10 g/L, a potassium pyrophosphate ($K_4P_2O_7$) concentration of about 50 to 100 g/L, and a chromium trioxide ($CrO_3$) concentration of about 0.5 to 2 g/L to form the release layer 30 onto the shiny surface 11 of the carrier foil 10. The pH of the plating bath ranges from about 1 to 10, while the temperature ranges from about 10 to 50° C., the electric flux ranges from about 1 to 2.5 A/dm$^2$, and the energizing time is about 20 seconds. Moreover, the release layer 30 is preferably a metal alloy formed with a combination of the group consisting of molybdenum, nickel, chromium, and potassium.

The carrier foil 10 along with the release layer 30 are immersed into a plating bath having a cupric pyrophosphate ($Cu_2P_2O_7 \cdot 3H_2O$) concentration of about 10 to 60 g/L, and a potassium pyrophosphate ($K_4P_2O_7$) concentration of about 100 to 400 g/L to form the protective layer 40 on the release layer 30. The pH of the plating bath ranges from about 6 to 10, while the temperature ranges from about 10 to 60° C., the electric flux ranges from about 1 to 5 A/dm$^2$, and the energizing time is about 15 seconds. The protective layer 40 is a cupric pyrophosphate layer.

The carrier foil 10 along with the release layer 30, and the protective layer 40 are immersed into a plating bath having a copper ion concentration of about 50 to 100 g/L and a sulfuric acid concentration of about 90 to 125 g/L to form the ultra-thin copper layer 50 having a shiny surface 51 and a matte surface 52 on the protective layer 40. The plating bath temperature ranges from about 40 to 70° C., the electric flux is about 25 A/dm$^2$, and the energizing time is about 20 seconds. The thickness of the ultra-thin copper layer 50 ranges from about 1 to 6 μm.

The carrier foil 10 along with the release layer 30, the protective layer 40, and the ultra-thin copper foil 50 are immersed into a quaternary alloy plating bath having a nickel sulfate hexahydrate concentration of about 1 to 40 g/L, a copper sulfate pentahydrate concentration of about 10 to 60 g/L, a cobalt sulfate heptahydrate concentration of about 10 to 50 g/L, and a manganese sulfate hydrate concentration of about 10 to 40 g/L and passed through a weaving process to form the blackening treated layer 80 on the matte surface 52 of the ultra-thin copper layer 50. The pH of the plating bath ranges from about 1 to 10, while the temperature ranges from about 10 to 60° C., the electric flux ranges from about 1 to 20 A/dm$^2$, and the energizing time is about 15 seconds.

Successively, the blackening treated layer 80 and the matte surface 12 of the carrier foil 10 are rustproof with the application of galvanized zinc, nickel and chromate, and then are coated with silane rendering two heat and rust proof layers 70 to form on both the blackening treated layer 80 and the matte surface 12 of the copper foil 10. Thus, resulting with the third embodiment of the copper foil structure having blackened ultra-thin foil.

Figure 4:
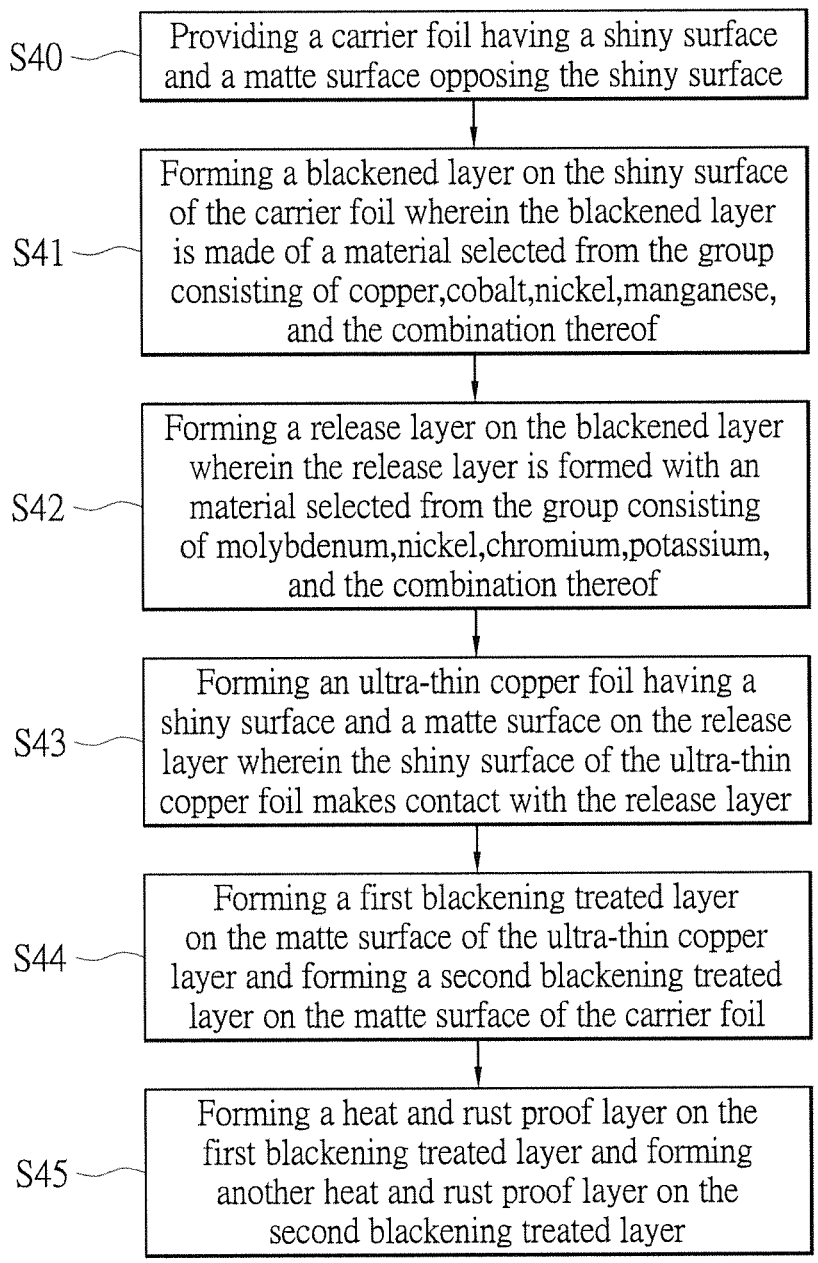
FIG. 4 is a flow diagram of the manufacturing method according to a fourth embodiment of the instant disclosure.
Figure 4A:
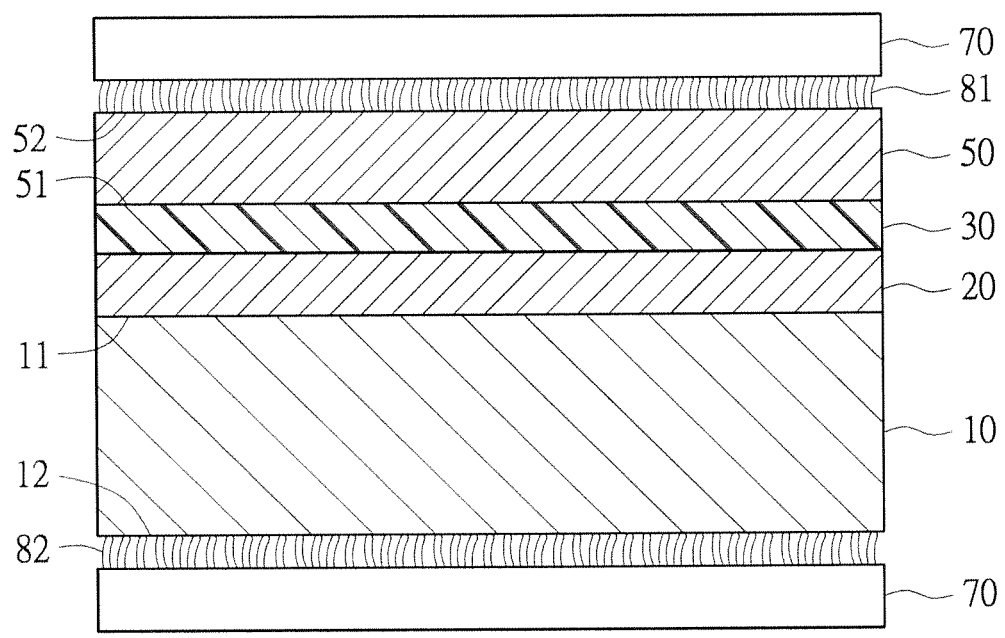
FIG. 4A is a cross-sectional view of a manufactured copper foil structure according to the fourth embodiment of the instant disclosure.

In FIGS. 4 and 4A, a flow diagram and a cross-sectional view of the method for manufacturing a copper foil structure with blackened ultra-thin copper foil respectively illustrate a third embodiment of the instant disclosure. Briefly, the method is initiated with a carrier foil 10 having a shiny surface 11 and a matte surface 12. Next, a blackened layer 20 is formed on the shiny surface 11 of the carrier foil 10, in which the blackened layer 20 is made of a material selected from the group consisting of copper, cobalt, nickel, manganese, and the combination thereof. Next, a release layer 30 is formed on the blackened layer 20, in which the release layer 30 is made of a material selected from the group consisting of molybdenum, nickel, chromium, potassium, and the combination thereof. Next, an ultra-thin copper foil 50 having a shiny surface 51 and a matte surface 52 is formed on the release layer 30 which makes contact with the shiny surface 51. Then a first blackening treated layer 81 is formed on the matte surface 52 of the ultra-thin copper layer 50. And a second blackening treated layer 82 is formed on the matte surface 12 of the carrier foil 10. Successively, two heat and rust proof layer 70 are formed, while one of the heat and rust proof layers 70 is formed on the first blackening treated layer 81, the other heat and rust proof layer 70 is formed on the second blackening treated layer 82.

In further details, the carrier foil 10 is a very low profile (VLP) copper foil from South Asia, of which the thickness ranges from about 18 to 35 m, and is near a cathode side and a side of a plating solution of the copper foil displaying a shiny appearance. Moreover, the carrier foil 10 exhibits low roughness and thickness similar to the size of a pinhole. The surface roughness (parameter used: an average of 10 points (Rz)) of the carrier foil 10 is less than 2.0 m and is defined by the shiny surface 11 and the matte surface 12. The carrier foil 10 is then immersed into a plurality of plating baths to electrodeposit different layers thereon.

Initially, the carrier foil 10 is immersed into a quaternary alloy plating bath having a nickel sulfate hexahydrate concentration of about 1 to 40 g/L, a copper sulfate pentahydrate concentration of about 10 to 60 g/L, a cobalt sulfate heptahydrate concentration of about 10 to 50 g/L, and a manganese sulfate hydrate concentration of about 10 to 40 g/L to form the blackened layer 20 on the shiny surface of the carrier foil 10. The pH of the plating bath ranges from about 1 to 10, while the temperature ranges from about 10 to 60° C., the electric flux ranges from about 1 to 20 A/dm$^2$, and the energizing time is about 15 seconds. Moreover, the blackened layer 20 is preferably a metal alloy formed with a combination of the group consisting of copper, cobalt, nickel, and manganese.

The carrier foil 10 along with the blackened layer 20 are then immersed into a quaternary alloy plating bath having a nickel sulfate hexahydrate concentration of about 10 to 50 g/L, a sodium molybdate dihydrate concentration of about 0.5 to 10 g/L, a potassium pyrophosphate ($K_4P_2O_7$) concentration of about 50 to 100 g/L, and a chromium trioxide ($CrO_3$) concentration of about 0.5 to 2 g/L to form the release layer 30 onto the blackened layer 20. The pH of the plating bath ranges from about 1 to 10, while the temperature ranges from about 10 to 50° C., the electric flux ranges from about 1 to 2.5 A/dm$^2$, and the energizing time is about 20 seconds. Moreover, the release layer 30 is preferably a metal alloy formed with a combination of the group consisting of molybdenum, nickel, chromium, and potassium.

The carrier foil 10 along with the blackened layer 20, and the release layer 30 are immersed into a plating bath having a copper ion concentration of about 50 to 100 g/L and a sulfuric acid concentration of about 90 to 125 g/L to form the ultra-thin copper layer 50 having a shiny surface 51 and a matte surface 52 on the release layer 30 which makes contact with the shiny surface 51. The plating bath temperature ranges from about 40 to 70° C., the electric flux is about 25 A/dm$^2$, and the energizing time is about 20 seconds. The thickness of the ultra-thin copper layer 50 ranges from about 1 to 6 μm.

The carrier foil 10 along with the blackened layer 20, the release layer 30, and the ultra-thin copper foil 50 are immersed into a quaternary alloy plating bath having a nickel sulfate hexahydrate concentration of about 1 to 40 g/L, a copper sulfate pentahydrate concentration of about 10 to 60 g/L, a cobalt sulfate heptahydrate concentration of about 10 to 50 g/L, and a manganese sulfate hydrate concentration of about 10 to 40 g/L and passed through a weaving process to form the first blackening treated layer 81 on the matte surface 52 of the ultra-thin copper layer 50 and the second blackening treated layer 82 on the matte surface 12 of the carrier foil 10. The pH of the plating bath ranges from about 1 to 10, while the temperature ranges from about 10 to 60° C., the electric flux ranges from about 1 to 20 A/dm$^2$, and the energizing time is about 15 seconds.

Successively, the first blackening treated layer 81 and the second blackening treated layer 82 are rustproof with the application of galvanized zinc, nickel and chromate, and then are coated with silane rendering two heat and rust proof layers 70 to form on the first blackening treated layer 81 and the second blackening treated layer 82. Thus, resulting with the second embodiment of the copper foil structure having blackened ultra-thin foil.

In all of the embodiments of the instant disclosure, the carrier foil 10 is not limited to copper foil, aluminum foil, titanium foil, stainless steel foil, etc. to affect the basic properties (such as peeling, etching, and resistance to high temperature) of the instant disclosure, and the thickness of the carrier foil 10 is likewise not limited thereby. However, with the application of the VLP copper foil, the overall properties of the instant disclosure is enhanced.

Referring to Table 1 below, all of the embodiments of the instant disclosure are compared against comparative examples to illustrate differences in peeling properties and chroma thereof. Chroma meter from Minolta, model number CR410, is used to measure the chroma of the examples and embodiments. The first comparative example lacks the blackened layer 20 while the second comparative example lacks the protective layer 40 when compared to the first embodiment.

TABLE 1

|  | Shiny surface of the ultra-thin copper layer (Contacting with carrier) | | Matte surface of the ultra-thin copper layer (Not contacting with carrier) | | Susceptibility to peeling |
| --- | --- | --- | --- | --- | --- |
|  | Chroma (Y value) | Description | Chroma (Y value) | Description |  |
| 1$^{st}$ Embodiment | 26.78 | Dark Gray | 16.65 | Pink | o |
| 2$^{nd}$ Embodiment | 14.37 | Dark Gray | 4.50 | Deep black | o |
| 3$^{rd}$ Embodiment | 76.51 | Bright copper | 4.50 | Deep black | o |
| 4$^{th}$ Embodiment | 8.50 | Black | 17.00 | Pink | o |
| 1$^{st}$ Comparative example | 76.30 | Bright copper | 16.70 | Pink | o |
| 2$^{nd}$ Comparative example | 68.16 | Light Gray | 17.21 | Pink | o | o: High
x: Low

Hereby, the instant disclosure has three types of blackened treatment for the carrier foil 10 or the ultra-thin copper foil 50: the single-sided, double-sided, and quadruple-sided. All three types of treatment can provide desirable durability to the environment, desirable carrier peel strength, and resistance to high temperature, moisture, alkali, etc. Even under harsh temperature and pressure environments, the carrier foil 10 and the ultra-thin copper foil 50 still retain the desirable peeling properties which are suitable for applying on high density and finely printed circuit board, multilayer printed circuit board, flip-chip film, polyimide film (PI). IC carrier substrate, etc. In addition, laser drilling can be directly applied to the circuit board, thereby eliminating the blackening and browning process, shielding electromagnetic waves, and providing a desirable appearance.

Referring to FIG. 4A once again, the instant disclosure also includes a copper foil structure having a blackened ultra-thin copper foil which has a carrier foil 10, a release layer 30, an ultra-thin copper layer 50, and at least one blackened layer 20. The carrier foil 10 includes a matte surface 12 and a shiny surface 11 in which the release layer 30 is formed thereon. The release layer 30 is made of a material selected from the group consisting of molybdenum, nickel, chromium, potassium, and the combination thereof. The ultra-thin copper foil 50 having a shiny surface 51 and a matte surface 52 is formed on the release layer 30. At least one blackened layer 20 is formed on one of the following layers: the shiny surface 11 of the carrier foil 10, the matte surface 12 of the carrier foil 10, and the matte surface 52 of the ultra-thin copper foil 50. The blackened layer 20 is made of a material selected from the group consisting of copper, cobalt, nickel, manganese, and the combination thereof, for example, copper cobalt alloy, cobalt nickel alloy, nickel manganese alloy, etc.

Furthermore, the structure selectively includes a roughened layer 60, two heat and rust proof layers 70 or a blackening treated layer 80 wherein the roughened layer 60 or the blackening treated layer 80 is selectively formed on the matte surface 52 of the ultra-thin copper foil 50. One of the two heat and rust proof layers 70 is formed on the roughened layer 60 while the other heat and rust proof layer 70 is formed on the matte surface 12 of the carrier foil 10.

Specifically, the blackened layer 20 and the blackening treated layer 80 can be formed by electroplating via a plating bath having copper ions, cobalt ions, nickel icons, and manganese ions with molality ratio as follow 10.5:17.5:1:4.5, respectively.

In further details, the blackened layer 20 is a quaternary alloy having copper, cobalt, nickel and manganese formed via electroplating in a plating bath having a nickel sulfate hexahydrate concentration of about 1 to 40 g/L, a copper sulfate pentahydrate concentration of about 10 to 60 g/L, a cobalt sulfate heptahydrate concentration of about 10 to 50 g/L, and a manganese sulfate hydrate concentration of about 10 to 40 g/L. The release layer 30 is a quaternary alloy formed via electroplating in a plating bath having a nickel sulfate hexahydrate concentration of about 10 to 50 g/L, a sodium molybdate dihydrate concentration of about 0.5 to 10 g/L, a potassium pyrophosphate ($K_4P_2O_7$) concentration of about 50 to 100 g/L, and a chromium trioxide ($CrO_3$) concentration of about 0.5 to 2 g/L. Similarly, the blackening treated layer 80 is formed by an electroplating process, and then a weaving process.

In summary, the carrier foil in the structure according to the instant disclosure is a very low profile copper foil which has desirable durability to environment, and resistance to high temperature, moisture, acid, alkali, etc. The release layer of the structure has desirable release properties which is a quaternary alloy made from molybdenum, nickel, chromium, and potassium. As a result, even after high temperature compression, the carrier foil and the ultra-thin copper foil have desirable bonding without having to comprise the peeling properties therebetween. With the three types of blackened treatment such as the single-sided, double-sided, and quadruple-sided, the structure in the instant disclosure is suitable for applications on high density and fine circuit printed circuit board, multilayer printed circuit board, flip-chip film, polyimide film (PI), IC carrier substrate, etc. In addition, laser drilling can be directly applied to the circuit board, thereby eliminating the blackening and browning process, masking electromagnetic waves, and providing desirable appearances. Moreover, the peel strength between the ultra-thin copper foil and a substrate of the structure is enhanced via the application of the roughened layer, blackening treated layer and heat and rust proof layer.

The figures and descriptions supra set forth illustrated the preferred embodiments of the instant disclosure; however, the properties of the instant disclosure are by no means restricted thereto. All changes, alternations, combinations or modifications conveniently considered by those skilled in the art are deemed to be encompassed within the scope of the instant disclosure delineated by the following claims.

What is claimed is:

1. A copper foil structure having a blackened ultra-thin foil with a chroma value Y of less than or equal to 25 and a selectable appearance from one of the following: single-sided, double-sided, triple-sided and quadruple-sided blackening, the copper foil structure comprising:
   a carrier foil having a shiny surface and a matte surface opposing the shiny surface;
   a blackened layer formed on the shiny surface of the carrier foil and made of a material selected from the group consisting of copper, cobalt, nickel, manganese, and the combination thereof;
   a release layer formed on the blackened layer and made of a material selected from the group consisting of molybdenum, nickel, chromium, potassium, and the combination thereof; and
   an ultra-thin copper foil forming on the release layer.

2. The structure as recited in claim 1 further comprising:
   a roughened layer formed on the ultra-thin copper layer; and
   two heat and rust proof layers, one of the heat and rust proof layers formed on the roughened layer while the other thereof formed on the matte surface of the carrier foil.

3. The structure as recited in claim 1 further comprising:
   a blackening treated layer formed on the ultra-thin copper layer; and
   two heat and rust proof layers, one of the heat and rust proof layers formed on the blackening treated layer while the other thereof formed on the matte surface of the carrier foil.

4. The structure as recited in claim 3 further comprising:
   a second blackening treated layer formed between the carrier foil and the other heat and rust proof layer.

5. The structure as recited in claim 1, wherein the blackened layer undergoes electroplating in a plating bath having ions of copper, cobalt, nickel, and manganese at a molality ratio of 10.5:17.5:1:4.5, respectively to form a quaternary alloy having copper, cobalt, nickel and manganese.

6. The structure as recited in claim 1, wherein the blackened layer undergoes electroplating in a plating bath having a nickel sulfate hexahydrate concentration of about 1 to 40 g/L, a copper sulfate pentahydrate concentration of about 10 to 60 g/L, a cobalt sulfate heptahydrate concentration of about 10 to 50 g/L, and a manganese sulfate hydrate concentration of about 10 to 40 g/L to form a quaternary alloy having copper, cobalt, nickel and manganese.

* * * * *